(12) United States Patent
Sugamoto et al.

(10) Patent No.: US 6,545,940 B2
(45) Date of Patent: Apr. 8, 2003

(54) SEMICONDUCTOR INTEGRATED CIRCUIT HAVING ENHANCED ACQUISITION OF EXTERNAL SIGNAL

(75) Inventors: Hiroyuki Sugamoto, Kasugai (JP); Satoshi Takashima, Kasugai (JP); Yoshiyuki Ishida, Kasugai (JP); Yasushige Ogawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/810,495

(22) Filed: Mar. 19, 2001

(65) Prior Publication Data

US 2002/0036946 A1 Mar. 28, 2002

(30) Foreign Application Priority Data

Sep. 25, 2000 (JP) ........................................ 2000-290693

(51) Int. Cl.[7] .................................................. G11C 8/00
(52) U.S. Cl. ................... 365/233; 365/194; 365/189.05
(58) Field of Search ................................ 365/233, 191, 365/194, 189.05, 230.08, 230.06

(56) References Cited

U.S. PATENT DOCUMENTS 6,147,905 A * 11/2000 Seino .................... 365/185.11
6,295,245 B1 * 9/2001 Tomita et al. .............. 365/222
6,353,561 B1 * 3/2002 Funyu et al. ............... 365/195

* cited by examiner

*Primary Examiner*—David Nelms
*Assistant Examiner*—Thong Le
(74) *Attorney, Agent, or Firm*—Arent Fox Kintner Plotkin & Kahn, PLLC

(57) ABSTRACT

A semiconductor integrated circuit that acquires an external signal precisely in a high speed operation. The semiconductor integrated circuit includes an internal circuit for acquiring an external signal in response to an address acquisition signal. A first holding circuit is connected to the internal circuit to hold the external signal for a predetermined period in response to a holding signal and provide the held external signal to the internal circuit. A control circuit is connected to the first holding circuit to generate the holding signal using the address acquisition signal.

20 Claims, 6 Drawing Sheets

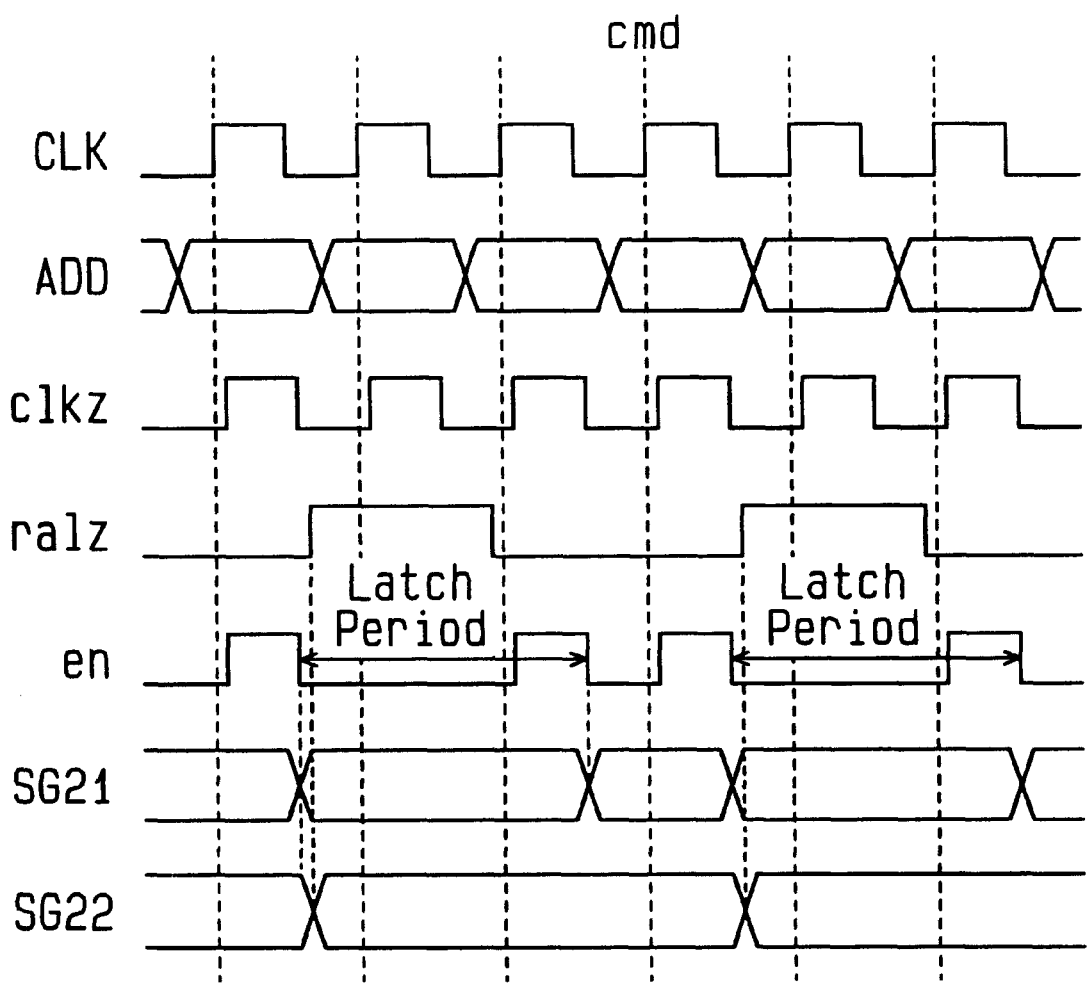

SEMICONDUCTOR INTEGRATED CIRCUIT HAVING ENHANCED ACQUISITION OF EXTERNAL SIGNAL

BACKGROUND OF THE INVENTION

The present invention relates to a semiconductor integrated circuit. More specifically, it relates to a semiconductor integrated circuit that acquires an external signal in synchronism with an external clock signal.

Recently, a semiconductor integrated circuit, such as a synchronous DRAM (hereinafter referred to as SDRAM), has been used to operate at high speed in synchronism with an external clock signal. In a clock-synchronized type semiconductor integrated circuit, timing signals are generated to drive the associated internal circuits using the external clock signal.

For example, in the SDRAM, an address acquisition signal is generated in synchronization with an external clock signal. The SDRAM acquires an external address signal in accordance with the address acquisition signal and supplies the address signal to an internal circuit. For the purpose of high performance, the high-speed operation of the SDRAM is required. However, the high speed of the SDRAM results in a short pulse width of the address acquisition signal, if the cycle of the external clock signal is short. This makes the address acquisition of the external address signal difficult. Therefore, it is desired to have a semiconductor integrated circuit that acquires the external address signal precisely.

FIG. 1 is a schematic block diagram of a portion of a conventional SDRAM 100. The SDRAM 100 includes an input buffer circuit 11, a latch circuit 12 and a decoder circuit 13.

The input buffer circuit 11 receives an external address signal ADD from an external device and amplifies the external address signal ADD.

The latch circuit 12 latches the amplified external address signal provided by the input buffer circuit 11 in accordance with an internal clock signal clkz and supplies the latch signal to the decoder circuit 13. The internal clock signal clkz is generated by a control circuit (clock buffer) and is synchronized with an external clock signal.

The decoder circuit 13 acquires the latch signal provided by the latch circuit 12 in response to an address acquisition signal ralz. The address acquisition signal ralz is generated in response to an external command by another control circuit (command decoder). The address acquisition signal ralz is synchronized with the internal clock signal clkz.

As shown in FIG. 2, the input buffer circuit 11 includes a plurality (even number, for example, two) of inverter circuits 21, 22 and provides the amplified external address signal ADD to the latch circuit 12.

The latch circuit 12 includes first and the second latches 23, 24. A transfer gate 25 of the first latch 23 is turned on in response to the internal clock signal clkz having a high level and is turned off in response to the internal clock signal clkz having a low level. A transfer gate 26 of the second latch 24 is turned on in response to the internal clock signal clkz having a low level and is turned off in response to the internal clock signal clkz having a high level. The first latch 23 latches the amplified external address signal provided by the input buffer circuit 11 in response to the internal clock signal clkz having a high level. The second latch 24 latches the external address signal latched by the first latch 23 in response to the internal clock signal clkz having a low level and outputs a latch signal SG1 having a level of the external address signal.

The decoder circuit 13 includes an input circuit having a latch 27. A transfer gate 28 of the latch 27 is turned on in response to the address acquisition signal ralz having a high level and is turned off in response to the address acquisition signal ralz having a low level. The latch 27 latches the latch signal SG1 of the latch circuit 12 during the period when the address acquisition signal ralz is at the high level and outputs a latch signal SG2 having a level of the latch signal SG1.

As shown in FIG. 3, the SDRAM 100 generates the internal clock signal clkz using the external clock signal CLK. The latch circuit 12 outputs the latch signal SG1 in response to a falling edge of the internal clock signal clkz. The SDRAM 100 receives a command cmd in response to a rising edge of the external clock signal CLK and generates an address acquisition signal ralz having a high level in response to a falling edge of the internal clock signal clkz for a predetermined period.

The latch 27 of the decoder circuit 13 latches the latch signal SG1 in response to the address acquisition signal ralz having a high level and outputs the latch signal SG2 having the level of the latch signal SG1 from the first rising edge to the next rising edge of the address acquisition signal ralz.

Since the latch 27 drives a circuit, such as a decoder circuit that uses the latch signal SG1, the address acquisition signal ralz for latching the latch signal SG1 should be maintained at high level for a predetermined period.

If the cycle of the external clock signal CLK is short in accordance with the high-speed operation, the pulse width of the address acquisition signal ralz should be short. This is because that if the pulse width of the address acquisition signal ralz is relatively long, the address acquisition signal ralz is spanned to the next cycle and the next external address signal is erroneously latched. However, if the pulse width of the address acquisition signal ralz is short in accordance with the pulse width of the external clock signal CLK, a latch period is short, so that it is difficult for the latch 27 to latch signals precisely.

In order to maintain an address acquisition signal ralz at a high level for a predetermined period, it has been proposed that a delay circuit be used. However, a delay circuit is susceptible to many external factors, such as variations in the process. Accordingly, it would be difficult to control the pulse width of the address acquisition signal ralz using a delay circuit for obtaining a desired pulse width.

SUMMARY OF THE INVENTION

An object of the present invention is to provide a semiconductor integrated circuit that acquires an external signal precisely in a high speed operation.

In a first aspect of the present invention, a semiconductor integrated circuit is provided. The circuit includes an internal circuit for acquiring an external signal in response to an acquisition signal. A first holding circuit is connected to the internal circuit to hold the external signal for a predetermined period in response to a holding signal and to provide the held external signal to the internal circuit. A control circuit is connected to the first holding circuit to generate the holding signal using the acquisition signal.

In a second aspect of the present invention, a semiconductor integrated circuit is provided. The circuit includes a first control circuit for generating an internal clock signal using an external clock signal and also generating an acquisition signal using the external clock signal and a control signal. An internal circuit is connected to the first control circuit to acquire an external signal in response to the acquisition signal. A first holding circuit is connected to the first control circuit to hold the external signal in response to the internal clock signal and generate a first held external signal. A second holding circuit is connected to the first holding circuit and the internal circuit to hold the first held external signal for a predetermined period in response to the holding signal and supply a second held external signal to the internal circuit. A second control circuit is connected to the first control circuit and the holding circuit to generate the holding signal using the acquisition signal.

In a third aspect of the present invention, a semiconductor integrated circuit is provided. The circuit includes a first control circuit for generating an internal clock signal using an external clock signal and also generating an acquisition signal using the external clock signal and a control signal. An internal circuit is connected to the first control circuit to acquire an external signal in response to the acquisition signal. A holding circuit is connected to the internal circuit to hold the external signal for a predetermined period in response to the holding signal and supply the held external signal to the internal circuit. A second control circuit is connected to the first control circuit and the holding circuit to generate the holding signal using the internal clock signal and the acquisition signal.

In a fourth aspect of the present invention, a method of acquiring an external signal in response to an acquisition signal is provided. The method includes: generating an acquisition signal in accordance with a control signal; generating a holding signal using the acquisition signal; holding an external signal in response to a clock signal to generate a first held external signal; holding the first held external signal for a predetermined time in response to the holding signal to generate a second held external signal; and acquiring the second held external signal in response to the acquisition signal.

In a fifth aspect of the present invention, a method of acquiring an external signal in response to an acquisition signal is provided. The method includes: generating an acquisition signal in accordance with a control signal; generating a holding signal using a clock signal and the acquisition signal; holding an external signal in response to the holding signal for a predetermined time to generate a held external signal; and acquiring the held external signal in response to the acquisition signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the description of the following exemplary embodiments along with the accompanying drawings in which:

FIG. 9 is a timing chart illustrating an operation of the semiconductor integrated circuit of FIG. 7.

DETAILED DESCRIPTION OF THE PREFERRED EMBODIMENTS

Figure 1:
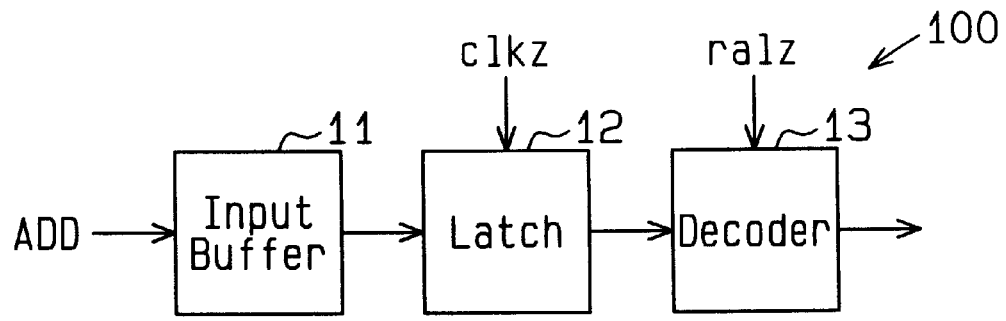
FIG. 1 is a schematic block diagram of a portion of a conventional semiconductor integrated circuit.
Figure 2:
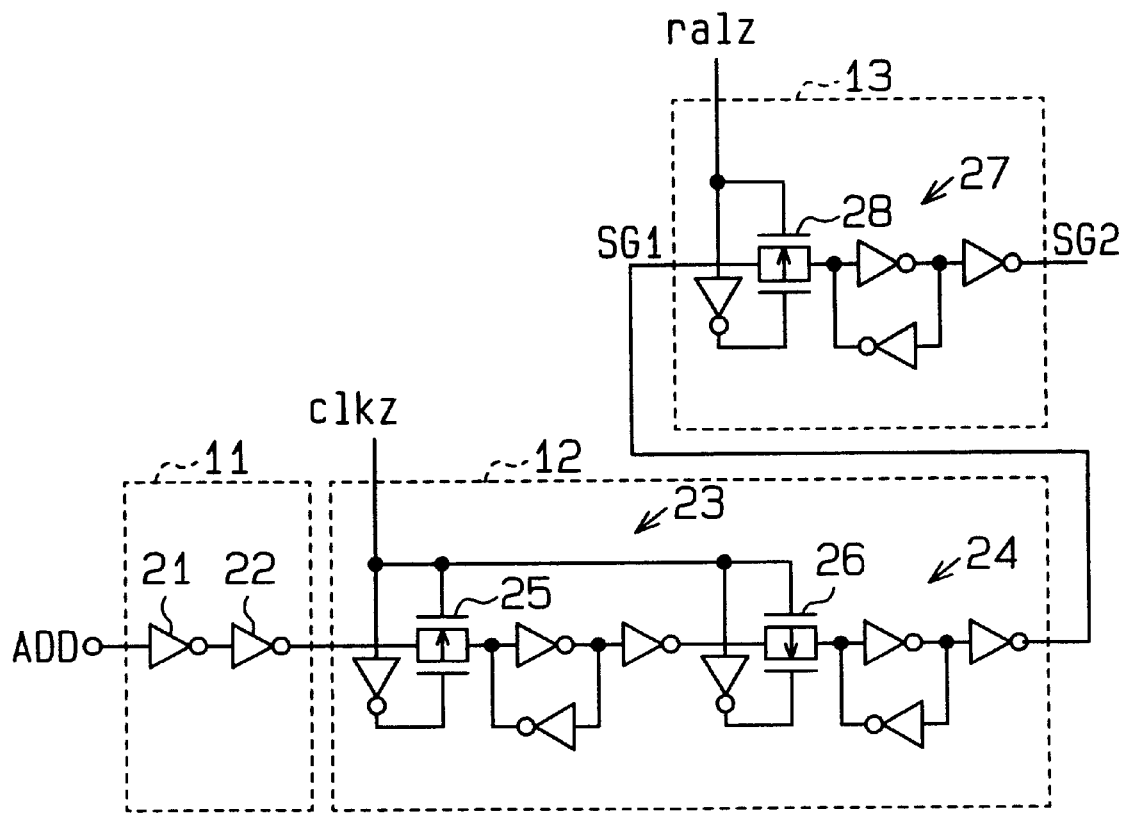
FIG. 2 is a schematic circuit diagram of the semiconductor integrated circuit of FIG. 1.
Figure 3:
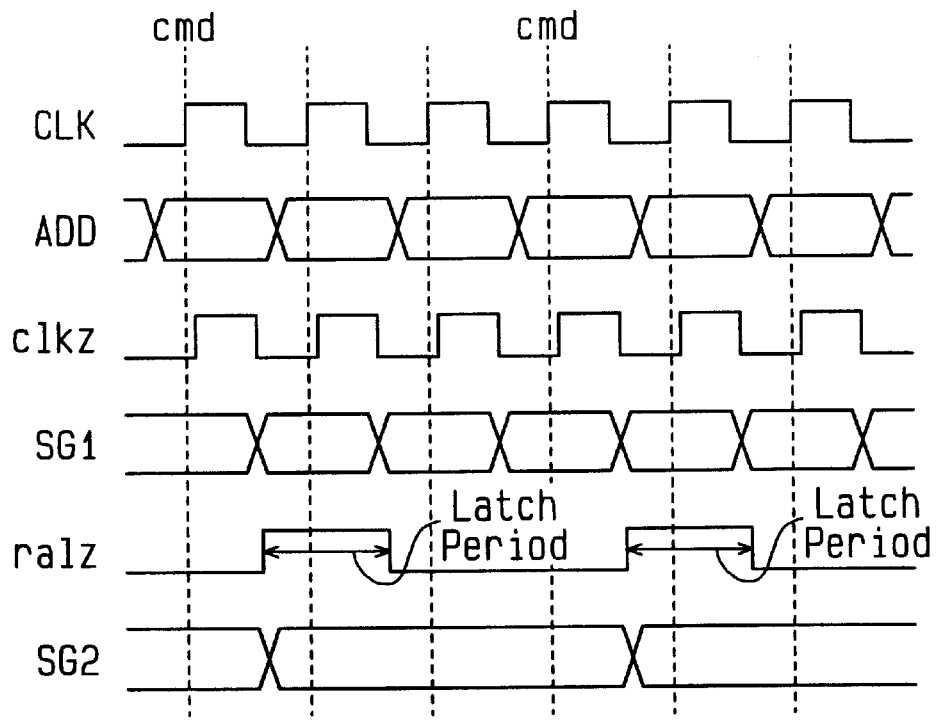
FIG. 3 is a timing chart illustrating an operation of the semiconductor integrated circuit of FIG. 1.

In the drawings, like numerals are used for like elements throughout.

Figure 4:
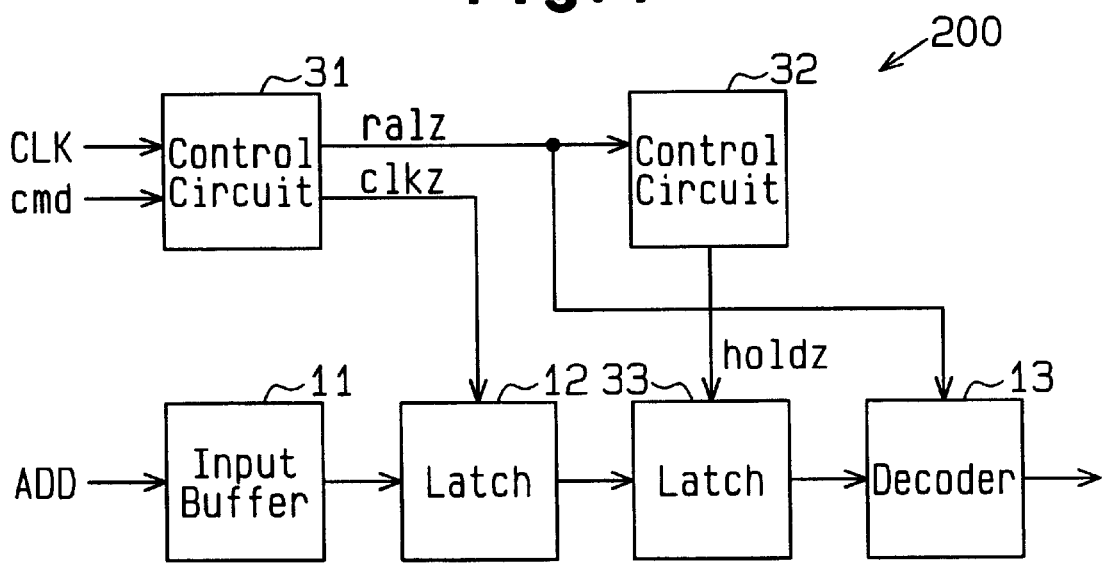
FIG. 4 is a schematic block diagram of a semiconductor integrated circuit according to a first embodiment of the present invention.

As shown in FIG. 4, an SDRAM 200 according to a first embodiment of the present invention includes a first control circuit 31, a second control circuit 32, an input buffer circuit 11, a first latch circuit 12, a second latch circuit 33, and a decoder circuit 13.

The first control circuit 31 includes a clock buffer which receives an external clock signal CLK and generates an internal clock signal clkz being synchronized with the external clock signal CLK. The first control circuit 31 also includes a command decoder, which receives an external command cmd in accordance with the external clock signal CLK, and decodes the external command cmd to generate several commands. The external command cmd is formed by a plurality of signals, such as a column address strobe signal and a write-enable signal. The first control circuit 31 generates an address acquisition signal ralz, which is synchronized with an internal clock signal clkz in accordance with a command for acquiring the external address signal. The first control circuit 31 provides the internal clock signal clkz to the first latch circuit 12, and provides the address acquisition signal ralz to both of the decoder circuit 13 and the second control circuit 32.

The second control circuit 32 generates a holding signal holdz in response to the address acquisition signal ralz provided by the first control circuit 31, and further provides the holding signal holdz to the second latch circuit 33. The holding signal holdz is supplied to the second latch circuit 33 such that the second latch circuit 33 holds the external address signal from the first latch circuit 12 for a predetermined period. More specifically, the second control circuit 32 generates the holding signal holdz having a high-level pulse width longer than a high-level pulse width of the address acquisition signal ralz by a predetermined period of time. The second control circuit 32 activates the holding signal holdz in response to a rising edge of the address acquisition signal ralz and deactivates the holding signal holdz after a predetermined period of time has elapsed from a falling edge of the address acquisition signal ralz.

The second latch circuit 33 latches the output signal of the first latch circuit 12 in response to the holding signal holdz provided by the second control circuit 32, and provides the latch signal to the decoder circuit 13. More specifically, the second latch circuit 33 latches the output signal of the first latch circuit 12 in response to the activated (for example, high level) holding signal holdz and holds a latch signal SG12 during a high-level output period of the holding signal holdz. That is, the latch signal SG12 having the level of the output signal SG11 of the first latch circuit 12 is held during the high-level output period. The second latch circuit 33 continuously provides the latch signal SG12 to the decoder circuit 13 in response to the deactivated (for example, low level) holding signal holdz. That is, a signal having a level substantially equal to that of the output signal of the first latch circuit 12 is provided by the second latch circuit 33 to the decoder circuit 13.

The high-level output period (pulse width) of the holding signal holdz is longer than the pulse width of the address acquisition signal ralz. The holding signal holdz is activated in synchronization with the address acquisition signal ralz, and is inactivated after a predetermined delay time in reference to the address acquisition signal ralz.

The high-level output period of the address acquisition signal ralz corresponds to a latch period of an input signal of the decoder circuit 13. The second latch circuit 33 provides the latch signal SG12 to the decoder circuit 13 in response to the holding signal holdz during a period longer than the latch period of the decoder circuit 13. That is, even if the latch period has passed, the latch signal SG12 is provided to the decoder circuit 13 for a predetermined period of time. Therefore, even if the cycle of the external clock signal CLK is short in accordance with the high speed operation, the decoder circuit 13 does not erroneously latch a signal other than the input signal to be latched. Further, because the holding signal holdz is generated from the address acquisition signal ralz, even if the pulse width of the address acquisition signal ralz is varied due to external factors such as variations in the process, the decoder circuit 13 still precisely latches the input signal.

Figure 5:
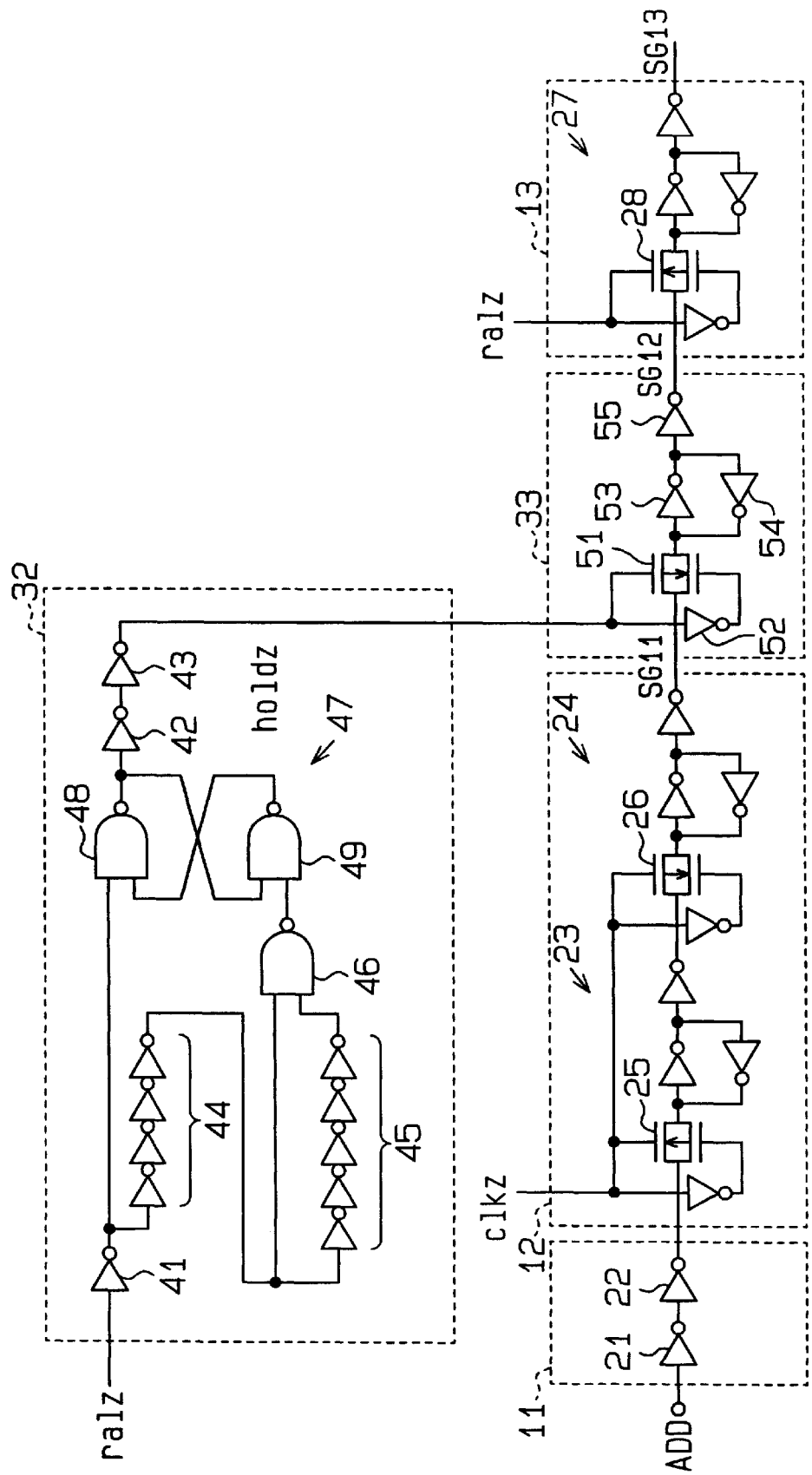
FIG. 5 is a schematic circuit diagram of the semiconductor integrated circuit of FIG. 4.

As shown in FIG. 5, the second control circuit 32 includes three 4-inverter circuits 41, 42 and 43, two delay circuits 44, 45, an NAND circuit 46, and a flip-flop 47.

An address acquisition signal ralz is provided to an input terminal of the first inverter circuit 41, and an output terminal of the first inverter circuit 41 is connected to the first delay circuit 44 and the flip-flop 47. The first delay circuit 44 includes even number (e.g., four in the first embodiment) of inverters connected in series. The first delay circuit 44 delays the address acquisition signal ralz by a delay time determined by the even number of the inverters, and provides the delayed signal to the second delay circuit 45 and the first input terminal of the NAND circuit 46. The second delay circuit 45 includes odd number (e.g., five in the first embodiment) of inverters connected in series. The second delay circuit 45 delays the delayed signal by a delay time determined by the odd number of the inverters and provides an inverted delayed signal to the second input terminal of the NAND circuit 46. The output terminal of the NAND circuit 46 is connected to the flip-flop 47.

The flip-flop 47 includes two NAND circuits 48, 49. An output signal of the first inverter circuit 41 and an output signal of the NAND circuit 49 are provided to the NAND circuit 48. An output signal of the NAND circuit 46 and an output signal of the NAND circuit 48 are provided to the NAND circuit 49. An output terminal of the NAND circuit 48 (i.e., the output terminal of the flip-flop 47) is connected to the second inverter circuit 42, and an output terminal of the second inverter circuit 42 is in turn connected to an input terminal of the third inverter circuit 43. The holding signal holdz is output from the third inverter circuit 43.

The second latch circuit 33 includes a transfer gate 51 and four inverter circuits 52, 53, 54, 55. The transfer gate 51 includes a p-channel MOS transistor and an n-channel MOS transistor. The holding signal holdz is provided to the gate of the p-channel MOS transistor. The holding signal holdz that is inverted by the inverter circuit 52 is provided to the gate of the n-channel MOS transistor. The transfer gate 51 is turned off in response to the holding signal holdz having a high level and is turned on in response to the holding signal holdz having a low level. When the transfer gate 51 is turned on, the output signal SG11 of the first latch circuit 12 is passing through the transfer gate 51. When the transfer gate 51 is turned off, the passage of the output signal SG11 is shut off.

The output signal SG11 of the first latch circuit 12 that passes through the transfer gate 51 is provided to the input terminal of the second inverter circuit 53. The output terminal of the third inverter circuit 54 is also connected to the input terminal of the second inverter circuit 53. The input terminals of the third and the forth inverter circuits 54, 55 are connected to the output terminal of the second inverter circuit 53. When the transfer gate 51 is turned off, a signal that is latched by the second and the third inverter circuit 53, 54 is provided to the decoder circuit 13 via the forth inverter circuit 55.

Figure 6:
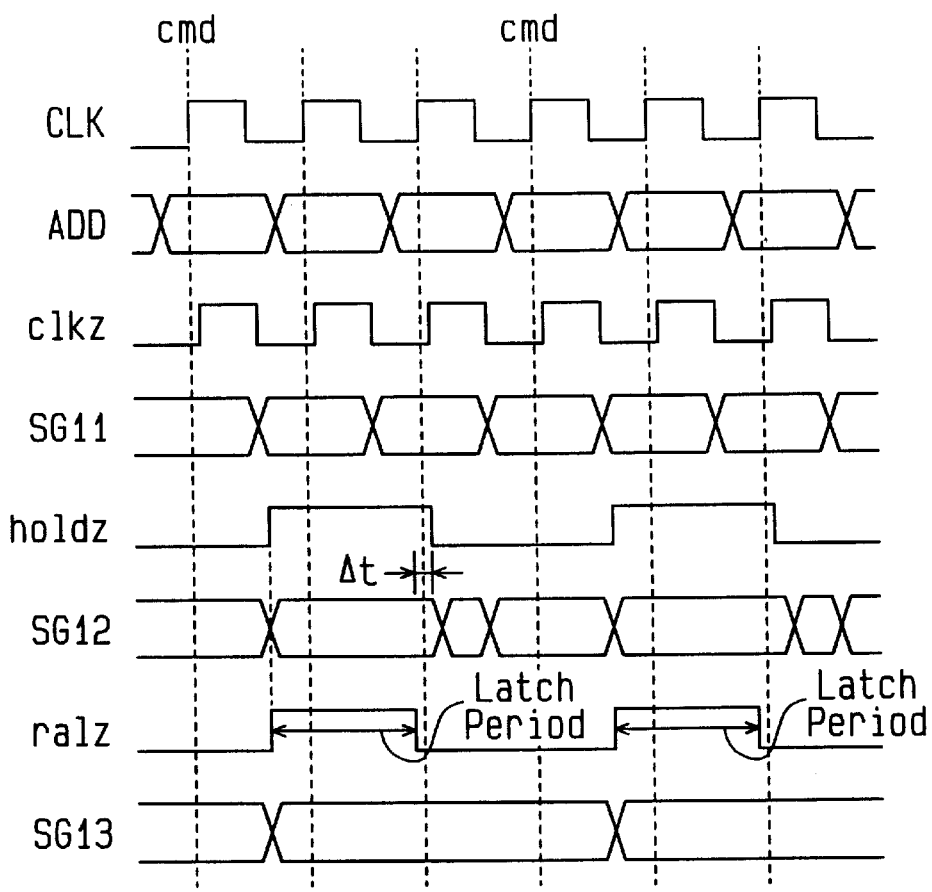
FIG. 6 is a timing chart illustrating an operation of the semiconductor integrated circuit of FIG. 4.

The operation of SDRAM 200 is described referring to FIG. 6.

The first control circuit 31 generates the internal clock signal clkz using the external clock signal CLK. The first latch circuit 12 outputs a latch signal SG11 having a level of the output signal of the input buffer 11 in response to a falling edge of the internal clock signal clkz.

The first control circuit 31 receives a command cmd in response to a rising edge of the external clock signal CLK and generates an address acquisition signal ralz in response to a falling edge of the internal clock signal clkz. The address acquisition signal ralz is held at a high level for a predetermined period of time. The second control circuit 32 generates the holding signal holdz having a high level during a time period longer by a time interval $\Delta t$ (see FIG. 6) than the output period of the high-level address acquisition signal ralz in accordance with the address acquisition signal ralz. The time interval $\Delta t$ corresponds to the delay time of the delay circuit 44. That is, the pulse width of the holding signal holdz is longer than the pulse width of the address acquisition signal ralz.

The second latch circuit 33 latches the output signal SG11 of the first latch circuit 12 in response to the high-level holding signal holdz and provides the latch signal SG12 to the decoder circuit 13 during an output period of the high-level holding signal holdz. The decoder circuit 13 latches the latch signal SG12 in response to the address acquisition signal ralz having a high level and provides a latch signal SG13 to the decoder circuit 13.

During a latch period of the decoder circuit 13 in which the address acquisition signal ralz is at a high level, the level of the output signal SG11 of the first latch circuit 12 is varied in response to a falling edge of the internal clock signal clkz. However, since the output of the latch signal SG12 by the second latch circuit 33 is held for a predetermined period of time by the holding signal holdz, which has a pulse width longer than that of the address acquisition signal ralz, the decoder circuit 13 does not latch any other signal than the input signal to be latched.

Furthermore, when the pulse width of the address acquisition signal ralz is varied due to external factors, the pulse width of the holding signal holdz also varies with the pulse width of the address acquisition signal ralz. Therefore, since the second latch circuit 33 holds the latch signal SG12 in accordance with the variation of the pulse width of the holding signal holdz, the decoder circuit 13 does not latch any other signal than the input signal to be latched.

The SDRAM 200 of the first embodiment has following advantages:

(1) The second control circuit 32 receives the address acquisition signal ralz from the first control circuit 31 and generates the holding signal holdz having a pulse width longer than that of the address acquisition signal ralz. The second latch circuit 33 latches the output signal of the first latch circuit 12 in accordance with the holding signal holdz and provides the latch signal SG12 to the decoder circuit 13 for a predetermined period of time. Therefore, even if the cycle of the external clock signal CLK is short in accordance with a high speed operation, the second latch circuit 33 provides the latch signal SG12 to the decoder circuit 13 for a period longer than the latch period of the decoder circuit 13. As a result, the decoder circuit 13 does not latch any other signal than the signal to be latched.

(2) since the holding signal holdz is generated by the second control circuit 32 in accordance with the address acquisition signal ralz, even if the pulse width of the address acquisition signal ralz is varied by external factors such as variations in the process, the decoder circuit 13 still precisely acquires a signal.

(3) The second control circuit 32 activates the holding signal holdz in response to a rising edge of the address acquisition signal ralz and deactivates the holding signal holdz after a predetermined period of time has elapsed from a falling edge of the address acquisition signal ralz. As a result, a holding signal holdz that has a pulse width longer than the high-level pulse width of the address acquisition signal ralz is easily generated.

Figure 7:
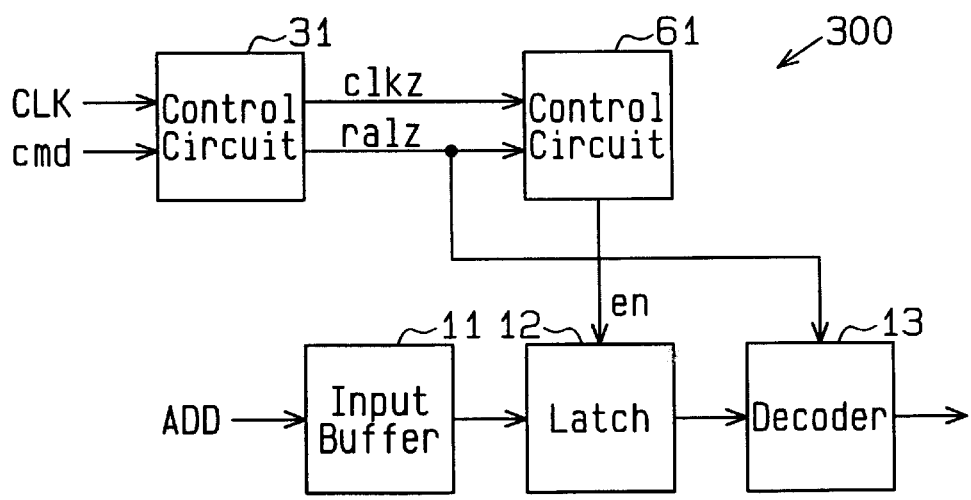
FIG. 7 is a schematic block diagram of a semiconductor integrated circuit according to a second embodiment of the present invention.

As shown in FIG. 7, an SDRAM 300 according to a second embodiment of the present invention includes a first control circuit 31, a second control circuit 61, an input buffer circuit 11, a latch circuit 12, and a decoder circuit 13.

The second control circuit 61 receives an internal clock signal clkz and an address acquisition signal ralz from the first control circuit 31 and generates an enable signal en. The enable signal en is provided to the latch circuit 12 so that the latch circuit 12 holds an input signal provided by the input buffer circuit 11 for a predetermined period of time. The enable signal en is synchronized with the internal clock signal clkz. A pulse of the enable signal en is not generated during the period corresponding to the address acquisition signal ralz. The period corresponding to the address acquisition signal ralz is preferably longer than the high-level period of the address acquisition signal ralz (a latch period of the decoder circuit 13). Specifically, the enable signal en has a pulse that is synchronized with the internal clock signal clkz. The pulse of the enable signal en is not generated during a period longer than the period extending from the rising edge to the falling edge of the address acquisition signal ralz.

The latch circuit 12 latches the output signal of the input buffer circuit 11 in response to the enable signal en provided by the second control circuit 61 and supplies the latch signal to the decoder circuit 13. More specifically, the latch circuit 12 acquires the output signal of the input buffer circuit 11 when the enable signal en is at a high level and latches the output signal of the input buffer circuit 11 in response to the enable signal en having a low level. The latch signal is held until the next falling edge of the enable signal en. The latch signal SG12 has a level of the output signal of the input buffer circuit 11.

The low-level period (pulse width) of the enable signal en is longer than the high-level period of the address acquisition signal ralz. It is preferred that the enable signal en is activated at the same time as, or at a time earlier than, the rising edge of the address acquisition signal ralz. The enable signal en is deactivated at the same time as, or after a predetermined time lagging behind, the falling edge of the address acquisition signal ralz.

The high-level period of the address acquisition signal ralz corresponds to the signal latch period of the decoder circuit 13. The latch circuit 12 provides the latch signal to the decoder circuit 13 in response to the enable signal en during a period longer than the latch period of the decoder circuit 13. That is, the provision of the latch signal is held from the beginning (or a time earlier than the beginning of) of the latch period to the time when the latch period completes. Therefore, even if the cycle of the external clock signal CLK is short in accordance with the high-speed operation, the latch signal is supplied by the latch circuit 12 in a period longer than the latch period of the decoder circuit 13. Therefore, the decoder circuit 13 does not latch any other signal than the signal to be latched. Furthermore, since the enable signal en is generated using the address acquisition signal ralz, even if the pulse width of the address acquisition signal ralz is varied due to external factors such as variations in the process, the decoder circuit 13 still precisely acquires a signal.

Figure 8:
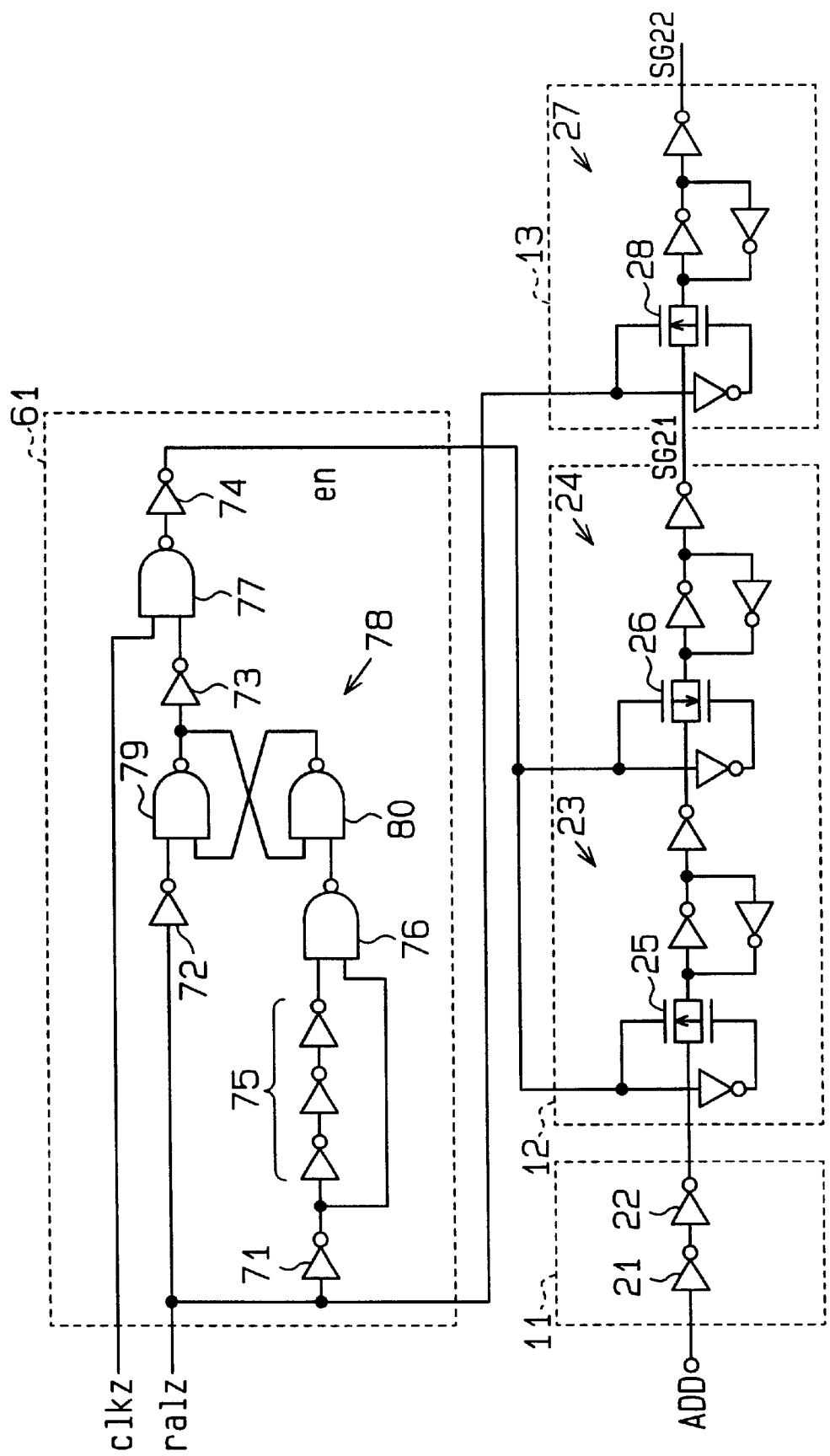
FIG. 8 is a schematic circuit diagram of the semiconductor integrated circuit of FIG. 7.

As shown in FIG. 8, the second control circuit 61 includes four inverter circuits 71, 72, 73, 74, a delay circuit 75, two NAND circuits 76, 77, and a flip-flop 78.

An address acquisition signal ralz is provided to the first and second inverter circuits 71, 72. An output terminal of the first inverter circuit 71 is connected to the delay circuit 75 and to the first input terminal of the NAND circuit 76. An output terminal of the second inverter circuit 72 is connected to the flip-flop 78.

The delay circuit 75 includes odd number (e.g., three in the second embodiment) of inverters connected in series. The delay circuit 75 delays an input signal by a delay time determined by the odd number of the inverters and provides a delayed signal to the second input terminal of the NAND circuit 76. An output terminal of the NAND circuit 76 is connected to the flip-flop 78.

The flip-flop 78 includes two NAND circuits 79, 80. An output signal of the second inverter circuit 72 and an output signal of the NAND circuit 80 are supplied to the NAND circuit 79. An output signal of the NAND circuit 76 and an output signal of the NAND circuit 79 are supplied to the NAND circuit 80. The output terminal of the NAND circuit 79 (an output terminal of the flip-flop 78) is connected to the third inverter circuit 73, and an output terminal of the third inverter circuit 73 is connected to the first input terminal of the NAND circuit 77. The output signal of the third inverter circuit 73 has a low-level pulse width longer than the high-level pulse width of the address acquisition signal ralz. That is, the output signal of the third inverter circuit 73 is deactivated in response to a rising edge of the address acquisition signal ralz, and is activated after a delay time of the delay circuit 75 from a falling edge of the address acquisition signal ralz.

The internal clock signal clkz is supplied to the second input terminal of the NAND circuit 77, and the output terminal of the NAND circuit 77 is connected to the input terminal of the forth inverter circuit 74. A enable signal en is output from the forth inverter circuit 74.

The latch circuit 12 includes first and second latches 23, 24. The first transfer gate 25 of the first latch 23 is turned on in response to a high-level enable signal en, and is turned off in response to a low-level enable signal en. The second transfer gate 26 of the second latch 24 is turned on in response to the low-level enable signal en and is turned off in response to the high-level enable signal en. The first latch 23 acquires the output signal of the input buffer circuit 11 in response to the high level enable signal en and latches the signal that is acquired when the first transfer gate 25 is turned off in response to the low level enable signal en. The latch signal is transferred from the first latch 23 to the second latch 24 via the second transfer gate 26 being turned on. The second latch 24 provides the signal SG21 having a level of the latch signal to the decoder circuit 13.

The operation of the SDRAM 300 is described referring to FIG. 9.

The first control circuit 31 generates an internal clock signal clkz using an external clock signal CLK and generates an address acquisition signal ralz in response to an external command cmd.

The second control circuit 61 generates an enable signal en using the internal clock signal clkz and the address acquisition signal ralz.

The first latch circuit 12 outputs a latch signal SG21 in response to a falling edge of the enable signal en. The first latch circuit 12 holds the latch signal SG21 until the next falling edge of the enable signal en. The decoder circuit 13 latches the latch signal SG21 in response to a high-level address acquisition signal ralz and provides a latch signal SG22 to the next stage of decoder circuit. During the latch period of the decoder circuit 13, the latch signal SG21 of the latch circuit 12 is not varied. Therefore, the decoder circuit 13 does not latch any other signal than the signal to be latched. Furthermore, even if the pulse width of the address acquisition signal ralz is varied by external factors, the enable signal en is generated in accordance with the variation and hence the decoder circuit 13 does not latch any other signal than the signal to be latched.

The SDRAM 300 of the second preferred embodiment has following advantages:

(1) The second control circuit 61 generates the enable signal en using the address acquisition signal ralz and the internal clock signal clkz that is provided by the first control circuit 31. The latch circuit 12 latches the output signal from the input buffer circuit 11 in response to the enable signal en for a predetermined period. As a result, even if the cycle of the external clock signal CLK is short during the high-speed operation, the decoder circuit 13 still latches the output signal of the input buffer circuit 11 precisely.

(2) The enable signal en is generated from the address acquisition signal ralz. Therefore, even if the pulse width of the address acquisition signal ralz is varied by external factors such as variations in the process, the decoder circuit 13 still acquires a signal precisely.

(3) The enable signal en can be readily generated using an inverter, an NAND circuit, and a flip-flop.

It should be apparent to those skilled in the art that the present invention may be embodied in many alternative forms without departing from the principle and the scope of the invention. Particularly, it should be understood that the invention may be embodied in the following forms.

The present invention may be applied to a circuit that acquires an external data signal in synchronism with an external clock signal CLK. Further, the present invention may be applied to a synchronized semiconductor integrated circuit that acquires a signal (such as external address signal) in synchronization with an external clock signal.

The control circuits 32 or 61 may include a counter that counts an external clock signal CLK or an internal clock signal clkz. The counter performs count operation in response to the external clock signal CLK or the internal clock signal clkz. The control circuit 32 generates a holding signal holdz in accordance with the count value of the counter. The control circuit 61 generates an enable signal en in accordance with the count value of the counter.

In the first exemplary embodiment, the first latch circuit 12 may be omitted.

The external clock signal CLK may be applied to the second control circuit 61 and the first latch circuit 12, as opposed to the internal clock signal clkz.

The second control circuit 32 may generate the holding signal holdz using the external clock signal CLK or the internal clock signal clkz. That is, the second control circuit 32 activates the holding signal holdz in response to a falling edge of the external clock signal CLK or the internal clock signal clkz.

Therefore, the present examples and embodiments are to be considered as illustrative and not restrictive and the invention is not to be limited to the details given herein, but may be modified within the scope and equivalence of the appended claims.

What is claimed is:

1. A semiconductor integrated circuit, comprising:
    an internal circuit for acquiring an external signal in response to an acquisition signal;
    a first holding circuit connected to the internal circuit, for holding the external signal for a predetermined period in response to a holding signal and providing the held external signal to the internal circuit; and
    a control circuit connected to the first holding circuit, for generating the holding signal using the acquisition signal.

2. The semiconductor integrated circuit according to claim 1, wherein the first holding circuit includes:
    a transfer gate through which the external signal is passed in response to the holding signal; and
    a latch for latching the external signal passed through the transfer gate.

3. The semiconductor integrated circuit according to claim 1, further comprising a second holding circuit connected to the first holding circuit, for holing the external signal in response to a clock signal and providing the held external signal to the first holding circuit.

4. The semiconductor integrated circuit according to claim 3, wherein the second holding circuit includes:
    a first transfer gate through which the external signal is passed in response to the clock signal;
    a first latch for latching the external signal passed through the first transfer gate to generate a first latched external signal;
    a second transfer gate for passing the first latched external signal therethrough by complementary operating with the first transfer gate in response to the clock signal; and
    a second latch for latching the first latched external signal passed through the second transfer gate to generate a second latched external signal.

5. The semiconductor integrated circuit according to claim 1, wherein the predetermined period is longer than the time interval during which the internal circuit acquires the external signal.

6. The semiconductor integrated circuit according to claim 5, wherein the control circuit delays the acquisition signal to generate a delayed signal and generates the holding signal using the acquisition signal and the delayed signal.

7. The semiconductor integrated circuit according to claim 1, wherein the control circuit generates the holding signal using the acquisition signal and a clock signal.

8. The semiconductor integrated circuit according to claim 7, wherein the control circuit generates the holding signal having a pulse that is synchronized with the clock signal, and wherein the pulse of the holding signal is not generated during the period corresponding to the acquisition signal.

9. The semiconductor integrated circuit according to claim 7, wherein the control circuit generates the holding signal having a pulse being synchronized with the clock signal, and wherein the pulse of the holding signal is not generated during the period extending from a time when the pulse that is synchronized with the clock signal is generated to a time when the acquisition signal is delayed by the predetermined time.

10. The semiconductor integrated circuit according to claim 7, wherein the control circuit generates the holding signal having a pulse that is synchronized with the clock signal and delays the acquisition signal to generate a delayed signal, and wherein a period during which a pulse of the holding signal is not generated is set in accordance with the acquisition signal and the delayed signal.

11. The semiconductor integrated circuit according to claim 1, wherein the internal circuit includes:
   a transfer gate through which the external signal is passed in response to the acquisition signal; and
   a latch for latching the external signal passed through the transfer gate.

12. A semiconductor integrated circuit comprising:
   a first control circuit for generating an internal clock signal using an external clock signal and generating an acquisition signal using the external clock signal and a control signal;
   an internal circuit connected to the first control circuit, for acquiring an external signal in response to the acquisition signal;
   a first holding circuit connected to the first control circuit, for holding the external signal in response to the internal clock signal and generating a first held external signal;
   a second holding circuit connected to the first holding circuit and the internal circuit, for holding the first held external signal for a predetermined period in response to the holding signal and supplying a second held external signal to the internal circuit; and
   a second control circuit connected to the first control circuit and the holding circuit, for generating the holding signal using the acquisition signal.

13. The semiconductor integrated circuit according to claim 12, wherein the predetermined period is longer than the period during which the internal circuit acquires the external signal.

14. A semiconductor integrated circuit comprising:
   a first control circuit for generating an internal clock signal using an external clock signal and generating an acquisition signal using the external clock signal and a control signal;
   an internal circuit connected to the first control circuit, for acquiring an external signal in response to the acquisition signal;
   a holding circuit connected to the internal circuit, for holding the external signal for a predetermined period in response to the holding signal and supplying the held external signal to the internal circuit; and
   a second control circuit connected to the first control circuit and the holding circuit, for generating the holding signal using the internal clock signal and the acquisition signal.

15. The semiconductor integrated circuit according to claim 14, wherein the predetermined period is longer than the period during which the internal circuit acquires the external signal.

16. A method of acquiring an external signal in response to an acquisition signal, the method comprising:
   generating the acquisition signal in accordance with a control signal;
   generating a holding signal using the acquisition signal;
   holding the external signal in response to a clock signal to generate a first held external signal;
   holding the first held external signal for a predetermined time in response to the holding signal to generate a second held external signal; and
   acquiring the second held external signal in response to the acquisition signal.

17. A method of acquiring an external signal in response to an acquisition signal, the method comprising:
   generating the acquisition signal in accordance with a control signal;
   generating a holding signal using a clock signal and the acquisition signal;
   holding the external signal in response to the holding signal for a predetermined time to generate the held external signal; and
   acquiring the held external signal in response to the acquisition signal.

18. The semiconductor integrated circuit according to claim 1, wherein the control circuit generates the holding signal on the basis of an external command.

19. A semiconductor integrated circuit having an internal circuit, comprising:
   a first control circuit for decoding an external command and generating an acquisition signal;
   a holding circuit for holding the external signal for a predetermined period in response to a holding signal and providing the held external signal to the internal circuit; and
   a second control circuit, connected to the first control circuit and the holding circuit, for generating the holding signal using the acquisition signal.

20. A semiconductor integrated circuit having an internal circuit comprising:
   a first control circuit for decoding an external command and generating an acquisition signal;
   a first holding circuit connected to the first control circuit, for holding an external signal on the basis of an internal clock signal;
   a second holding circuit connected to the first holding circuit, for holding the external signal for a predetermined period in response to a holding signal and supplying the held external signal to the internal circuit; and
   a second control circuit connected to the first control circuit and the second holding circuit, for generating the holding signal using the acquisition signal.

* * * * *